United States Patent
Kim et al.

(10) Patent No.: US 8,576,196 B2
(45) Date of Patent: Nov. 5, 2013

(54) TOUCH SCREEN AND METHOD OF MANUFACTURING THE SAME

(75) Inventors: Woon Chun Kim, Gyunggi-do (KR); Yong Soo Oh, Gyunggi-do (KR); Sang Hwan Oh, Gyunggi-do (KR); Jong Young Lee, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 473 days.

(21) Appl. No.: 13/017,329

(22) Filed: Jan. 31, 2011

(65) Prior Publication Data

US 2012/0068960 A1 Mar. 22, 2012

(30) Foreign Application Priority Data

Sep. 20, 2010 (KR) .................. 10-2010-0092620

(51) Int. Cl.
*G06F 3/045* (2006.01)
(52) U.S. Cl.
USPC ........... 345/174; 345/173; 178/18.01; 349/56
(58) Field of Classification Search
USPC ................ 345/173–179; 178/18.01–18.04; 349/56, 139
See application file for complete search history.

(56) References Cited

U.S. PATENT DOCUMENTS

| | | | | |
|---|---|---|---|---|
| 7,499,038 B2* | 3/2009 | Nishikawa et al. | ........... | 345/174 |
| 7,663,607 B2* | 2/2010 | Hotelling et al. | ............. | 345/173 |
| 2004/0051699 A1* | 3/2004 | Tanabe et al. | ................. | 345/173 |
| 2006/0132465 A1* | 6/2006 | Nishikawa et al. | ........... | 345/174 |
| 2008/0024461 A1* | 1/2008 | Richter et al. | ................. | 345/173 |
| 2008/0106522 A1* | 5/2008 | Nishikawa et al. | ........... | 345/173 |
| 2009/0046072 A1* | 2/2009 | Emig et al. | ...................... | 345/173 |
| 2009/0256820 A1* | 10/2009 | Yanase et al. | ................. | 345/174 |
| 2010/0231545 A1* | 9/2010 | Inaba et al. | ..................... | 345/173 |
| 2010/0259503 A1* | 10/2010 | Yanase et al. | ................. | 345/174 |
| 2011/0157087 A1* | 6/2011 | Kanehira et al. | .............. | 345/174 |

FOREIGN PATENT DOCUMENTS

JP 2005-019056 1/2005
JP 2010-181747 8/2010

OTHER PUBLICATIONS

Office Action for corresponding Korean App. No. 10-2010-0092620 dated Nov. 30, 2011.

* cited by examiner

*Primary Examiner* — Kimnhung Nguyen
(74) *Attorney, Agent, or Firm* — Ladas & Parry, LLP

(57) ABSTRACT

Disclosed herein are a touch screen and a method of manufacturing the same. The touch screen includes: a transparent substrate; a transparent electrode formed on the transparent substrate and including a sensing part sensing a touch input and an extension part extending from the sensing part to an edge of the transparent substrate; a wiring electrode formed at the edge of the transparent substrate and spaced apart from the extension part of the transparent electrode; and a conductive paste formed at the edge of the transparent substrate and covering both the extension part and the wiring electrode so as to electrically connect the transparent electrode to the wiring electrode, whereby the transparent electrode is formed after the wiring electrode is formed and the wiring electrode is connected to the transparent electrode through the conductive paste, thereby preventing the transparent electrode from being damaged.

16 Claims, 6 Drawing Sheets

TOUCH SCREEN AND METHOD OF MANUFACTURING THE SAME

CROSS REFERENCE TO RELATED APPLICATION

This application claims the benefit of Korean Patent Application No. 10-2010-0092620, filed on Sep. 20, 2010, entitled "Touch Screen And Method Of Manufacturing The Same", which is hereby incorporated by reference in its entirety into this application.

BACKGROUND OF THE INVENTION

1. Technical Field

The present invention relates to a touch screen and a method of manufacturing the same.

2. Description of the Related Art

With the continuous development in the electronic technology and the information technology fields, the relative importance of electronic devices is constantly increasing in everyday life, including work environment. In particular, as electronic technology continuously develops, touch screens are used in portable devices that are recently reduced in size and thickness. Touch screens, devices generally installed in display devices to detect positions on the screen touched by a user and control electronic devices, using information on the detected contact position as input information, in addition to controlling the screen of the display, have various advantages of being simply operated with minimal malfunction in a small space and very compatible with IT devices.

Meanwhile, the touch screen is classifiable as a resistive type, a capacitive type, an electromagnetic type, a surface acoustic wave (SAW) type, an infrared type, and so on. Among others, resistive and capacitive types are prevalently used in consideration of the functional and economical aspects.

FIGS. 1 and 2 are process plan views for explaining a method of manufacturing a touch screen according to the prior art. Hereinafter, a method of manufacturing a touch screen according to the prior art will be described with reference to these figures.

First, as shown in FIG. 1, a patterned transparent electrode 12 is formed on a transparent substrate 11. At this time, the transparent electrode 12 may be made of indium tin oxide (ITO) or a conductive polymer.

Next, as shown in FIG. 2, a wiring electrode 13 is formed at an edge of the transparent substrate 11 so as to be connected to the transparent electrode 12.

The touch screen has been manufactured in the prior art according to the manufacturing method as described above.

However, the method of manufacturing the touch screen according to the prior art forms the wiring electrode 13 after the transparent electrode 12 is formed, thereby causing a problem in that the transparent electrode 12 is damaged. More specifically, high heat is generated when the wiring electrode 13 is formed and thus, when the transparent electrode 12 is first formed on the transparent substrate 11, the heat generated at the time of forming the wiring electrode 13 is transferred to the transparent electrode 12 as it is, causing a problem in that the transparent electrode 12 is damaged, for example, increase in sheet resistance of the transparent electrode 12. In particular, when the transparent electrode 12 is made of a conductive polymer, the conductive polymer is more sensitive to heat, thereby causing a more serious problem.

SUMMARY OF THE INVENTION

The present invention has been made in an effort to provide a touch screen to prevent a transparent electrode from being damaged by heat generated at the time of forming a wiring electrode, and a method of manufacturing the same.

A touch screen according to a preferred embodiment of the present invention includes: a transparent substrate; a transparent electrode formed on the transparent substrate and including a sensing part sensing a touch input and an extension part extending from the sensing part to an edge of the transparent substrate; a wiring electrode formed at the edge of the transparent substrate and spaced apart from the extension part of the transparent electrode; and a conductive paste formed at the edge of the transparent substrate and covering both the extension part and the wiring electrode so as to electrically connect the transparent electrode to the wiring electrode.

Herein, the sensing part may sense a change in capacitance when a touch input is executed.

The extension part may be formed in plural, and the wiring electrode may include a plurality of connection parts spaced apart between the extension parts.

The transparent substrate on which the transparent electrode, the wiring electrode, and the conductive paste are formed may be formed in two sheets and a first adhesive layer may further be formed between the two sheets of transparent substrates.

The touch screen may further include: a second adhesive layer formed on the transparent substrate on which the transparent electrode, the wiring electrode, and the conductive paste are formed; and a window plate bonded to the transparent substrate by the second adhesive layer.

The transparent electrode may include a conductive polymer.

The wiring electrode may include copper, aluminum, gold, or silver.

The conductive paste may be a silver paste.

A method of manufacturing a touch screen according to another preferred embodiment of the present invention includes: forming a wiring electrode at an edge of a transparent substrate; forming a transparent electrode on the transparent substrate, the transparent electrode including a sensing part sensing a touch input and an extension part extending from the sensing part to the edge of the transparent substrate and be spaced apart from the wiring electrode; and electrically connecting the transparent electrode to the wiring electrode by applying a conductive paste so as to cover the extension part of the transparent electrode and the wiring electrode.

In this case, at the forming the wiring electrode, the wiring electrode may be formed by sputtering a metal.

The metal may include copper, aluminum, gold or silver.

At the forming the transparent electrode, the extension part may be formed in plural and a plurality of connection parts of the wiring electrode may be positioned between the extension parts.

The method may further include: after the electrically connecting, repeating the forming the wiring electrode, the transparent electrode, and the conductive paste on the transparent substrate; and bonding the two sheets of transparent substrates by interposing a first adhesive layer between the two sheets of transparent substrates.

The method may further include, after the electrically connecting, bonding the transparent substrate to a window plate by interposing a second adhesive layer between the transparent substrate on which the wiring electrode, the transparent electrode, and the conductive paste are formed and the window plate.

The transparent electrode may include a conductive polymer.

At the electrically connecting, the conductive paste may be a silver paste.

DESCRIPTION OF THE PREFERRED EMBODIMENTS

Figure 1:
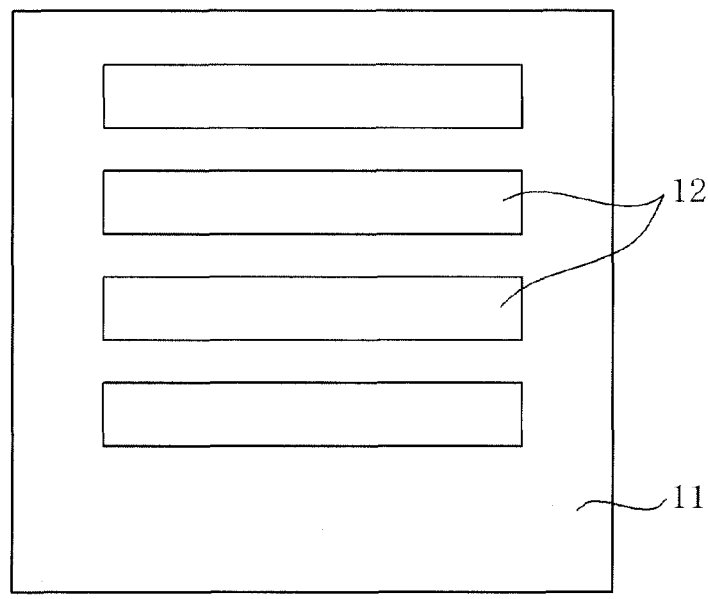
FIGS. 1 and 2 are process plan views for explaining a method of manufacturing a touch screen according to the prior art.
Figure 2:
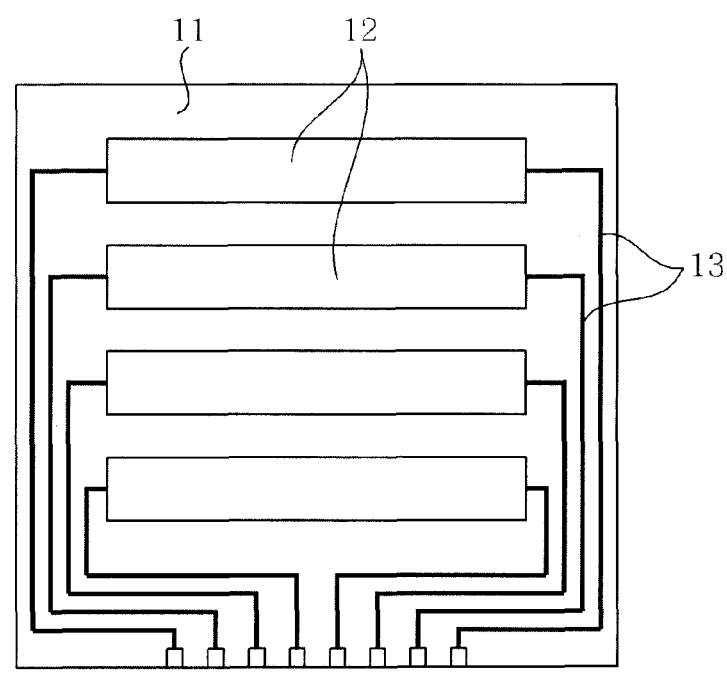

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, terms used in the specification, 'first', 'second', etc. can be used to describe various components, but the components are not to be construed as being limited to the terms. The terms are only used to differentiate one component from other components. Further, when it is determined that the detailed description of the known art related to the present invention may obscure the gist of the present invention, the detailed description thereof will be omitted.

Hereinafter, preferred embodiments of a linear vibrator according to the present invention will be described in detail with reference to the accompanying drawings.

Structure of Touch Screen

Figure 3:
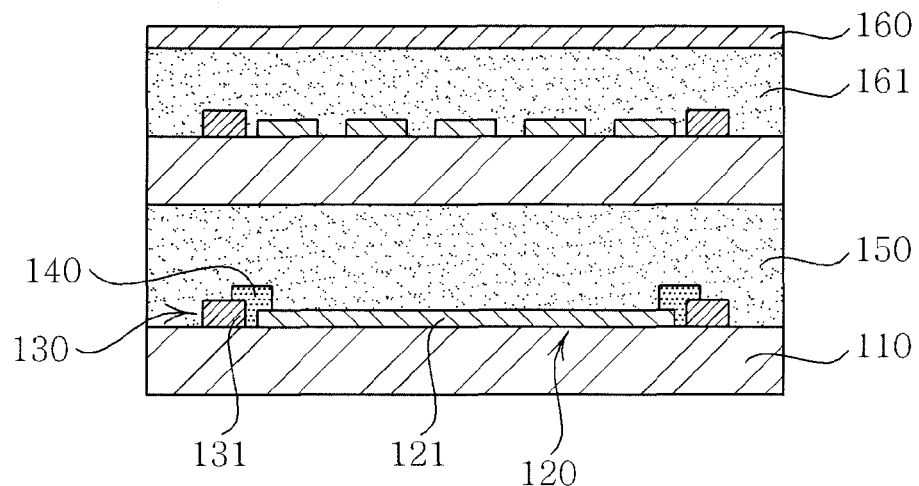
FIG. 3 is a cross-sectional view of a touch screen according to a preferred embodiment of the present invention.
Figure 4:
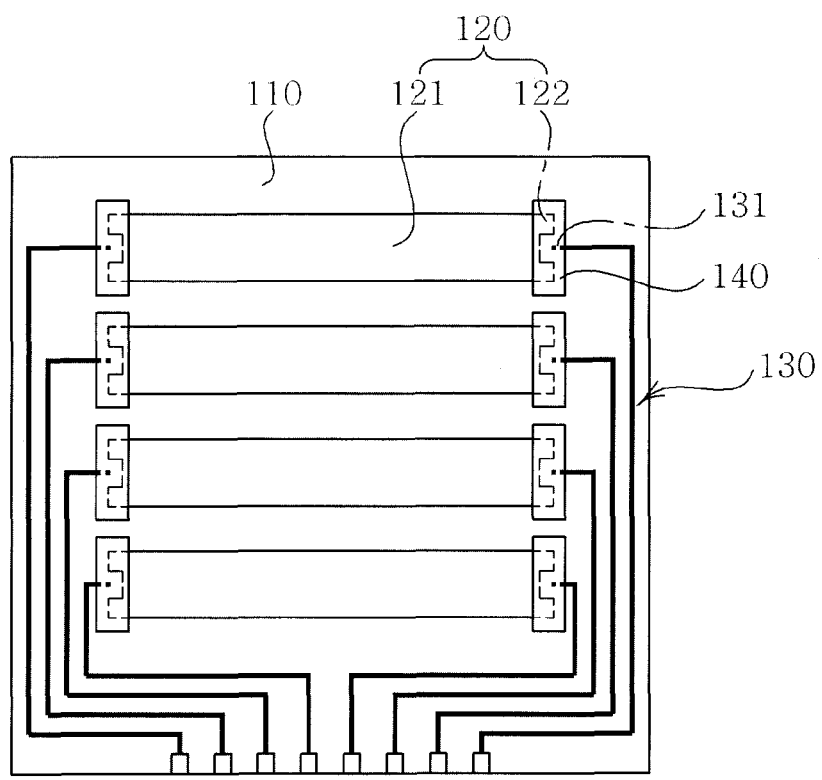
FIG. 4 is a plan view of a transparent substrate on which a transparent electrode, a wiring electrode, and a conductive paste of the touch screen of FIG. 3 are formed.

FIG. 3 is a cross-sectional view of a touch screen 100 according to a preferred embodiment of the present invention and FIG. 4 is a plan view of a transparent substrate 110 on which a transparent electrode 120, a wiring electrode 130, and a conductive paste 140 of the touch screen 100 are formed. Hereinafter, the touch screen 100 according to the present embodiment will be described with reference to this figure.

In this case, it will be previously noted that although the present embodiment will describe a two-layer capacitive touch screen, the present invention is not limited thereto but still includes a single-layer capacitive touch screen and a resistive touch screen.

As shown in FIGS. 3 and 4, the touch screen 100 according to the present embodiment includes two sheets of transparent substrates 110, a transparent electrode 120, a wiring electrode 130, a conductive paste 140, a first adhesive layer 150, and a window plate 160.

The transparent substrate 110, a member providing space in which the transparent electrode 120 is formed, is a member that becomes a base of the touch screen 100.

In this case, the transparent substrate 110 may be made of a transparent material so that an image from a display (not shown) installed at the lower portion of the touch screen 100 can be clearly transferred to a user. As the material, the transparent substrate 110 may, for example, be made of polyethyleneterephthalate (PET), polycarbonate (PC), polymethylmethacrylate (PMMA), polyethylenenaphthalenedicarboxylate (PEN), polyethersulfone (PES) or cyclic olefin copolymer (COC). In addition, glass or tempered glass may be generally used.

Furthermore, the transparent electrode 120 is formed on one surface of the transparent substrate 110, such that the transparent substrate 110 may be subjected to a high frequency treatment or a primer treatment in order to improve the adhesion with the transparent electrode 120.

The transparent electrode 120 is a member that is formed on one surface of the transparent substrate 110 to sense a change in capacitance at the time of touch input.

Herein, the transparent electrode 120 senses the change in capacitance from the touch input of a specific object, such as a user's body or a stylus pen, etc. and transmits the changes to a controller (not shown), and then the controller (not shown) recognizes the coordinates of the pressed position, thereby implementing desired operations. More specifically, when high frequency is diffused throughout the transparent electrodes 120 by receiving voltage through the wiring electrode 130 and then the touch input is applied by a human body or the like, a predetermined change in capacitance occurs while the transparent electrode 120 functions as an electrode and the window plate 160, the transparent substrate 110, the first adhesive layer 150 and/or a second adhesive layer 161 function as a dielectric, and the controller (not shown) can recognize the positions of the touch input or whether the touch screen is touched, etc., by detecting the changed waveform.

Meanwhile, the transparent electrode 120 may include a sensing part 121 and an extension part 122. Herein, the sensing part 121, which senses a change in capacitance from the touch input, may be formed in the inner side of the transparent substrate 110. In addition, the extension part 122 is extended to the edge of the transparent substrate 110 from the sensing part 121 and thus may subsequently be connected to the wiring electrode 130 through the conductive paste 140. In addition, the extension part 122 extends from the sensing part 121 and thus, corresponds to a portion protruded to the edge of the transparent electrode 120. FIG. 1 shows a case in which the extension part 122 is formed as two parts but it may also be formed as one or three or more parts.

In this configuration, the transparent electrode 120 may be made of a conductive material so as to sense the change in capacitance. In addition, the transparent electrode 120 may be made of a transparent material, since it is patterned over the transparent substrate 110. As the material, the transparent electrodes 120 may, for example, be made of conductive polymer containing poly-3,4-ethylenedioxythiophene/polystyrenesulfonate (PEDOT/PSS), polyaniline alone or a mixture thereof, or metal oxides, such as indium tin oxide (ITO).

In addition, the transparent electrodes 120 formed on the two sheets of transparent substrates 110 form an X-axis pattern and a Y-axis pattern, respectively, thereby making it possible to sense an X-axis coordinate and Y-axis coordinate of the touch input. Furthermore, FIGS. 3 and 4 show a case in which the sensing part 121 of the transparent electrode 120 has a bar type, but the shape of the sensing part 121 is not limited thereto but may be implemented to have a polygonal shape such as a diamond shape, a triangular shape, a quadrangular shape, or a circular shape, an oval shape, or the like.

Meanwhile, a single layer capacitive touch screen may be configured in a self capacitance scheme that the wiring electrode 130 is electrically connected to the sensing part 121 of each of the transparent electrodes 120 through a conductive paste 140 or in a mutual capacitance scheme that the transparent electrode 120 of the X-axis pattern and the Y-axis pattern are implemented on a single layer.

The wiring electrode 130 is a member that is formed at the edge of the transparent substrate 110 to apply voltage to the transparent electrode 120 through the conductive paste 140.

Herein, the wiring electrode 130 may include a connection part 131 spaced apart from the extension part 122 of the transparent electrode 120. In addition, when the extension part 122 is formed in plural, the connection part 131 is also formed in plural, such that the connection parts 131 may be disposed to be spaced apart between the extension parts 122.

Meanwhile, the wiring electrode 130 may be made of a material having excellent electrical conductivity so as to supply voltage to the transparent electrode 120. For example, the wiring electrode 130 may be made of a metal including copper (Cu), aluminum (Al), gold (Au), silver (Ag), or the like.

The conductive paste 140 is a member that is formed at the edge of the transparent substrate 110 to electrically connect the transparent electrode 120 and the wiring electrode 130 spaced apart from each other.

Herein, the conductive paste 140 is formed to cover both the extension part 122 of the transparent electrode 120 and the connection part 131 of the wiring electrode 130. Therefore, the transparent electrode 120 and the wiring electrode 130 may transmit and receive electrical signals through the conductive paste 140. In addition, as shown in FIG. 4, the conductive paste 140 may be formed to cover the extension part 122 and the connection part 131 for each unit pattern or cover the extension part 122 and the connection part 131 of all of the unit patterns at one time. In addition, when the extension part 122 and the connection part 131 are formed in plural, the conductive paste 140 may be formed to cover each of the extension parts 122 and the connection parts 131 for each unit or cover them at one time.

In addition, the conductive paste 140 may be made of a material having excellent conductivity so as to electrically connect the extension part 122 to the connection part 131. As the material, the conductive paste 140 may, for example, be made of a silver paste.

Meanwhile, the transparent electrode 120 is not directly connected to the wiring electrode 130 but is connected thereto through the conductive paste 140, thereby making it possible to reduce the effects of the wiring electrode 130 applied to the transparent electrode 120. More specifically, when the transparent electrode 120 is directly connected to the wiring electrode 130, the transparent electrode 120 may be affected by the wiring electrode 130, such as a noise signal or the like. However, in the present invention, the conductive paste 140 is interposed between the transparent electrode 120 and the wiring electrode 130, thereby making it possible to minimize the effects of the wiring electrode 130 applied to the transparent electrode 120.

The first adhesive layer 150 is a member that bonds two sheets of the transparent substrates 110 on which the transparent electrode 120, the wiring electrode 130, and the conductive paste 140 are formed, respectively.

Herein, the first adhesive layer 150 bonds the entire surfaces of the two sheets of transparent substrates 110, such that it may be made of a transparent material. As the material, the first adhesive layer 150 may, for example, be made of an optical clear adhesive (OCA).

Meanwhile, FIG. 3 shows a case in which the two sheets of transparent substrates 110 are bonded using the first adhesive layer 150 such that both the transparent electrodes 120 formed on the two sheets of transparent substrates 110 face the same direction (upper portion); however, the transparent substrates 110 may also be bonded such that the transparent electrodes 120 face each other.

The window plate 160 is a member that is formed on one surface of the transparent substrate 110 on which the transparent electrode 120 is formed to protect other components of the touch screen 100.

In this case, the window plate 160, which is a part receiving a touch input from a specific object, such as a user's body or a stylus pen, maintains the external appearance of an input unit of the touch screen 100. Therefore, the window plate 160 may be made of a transparent material having excellent durability to enable the touch screen 100 to be sufficiently protected from an external force, and to enable a display to be clearly viewed by a user, such as polyethylene terephthalate (PET) or a glass.

In addition, a second adhesive layer 161 may be interposed between the window plate 160 and the transparent substrate 110 so as to mutually fix the window plate 160 and the transparent substrate 110. At this time, the second adhesive layer 161 is entirely formed between the window plate 160 and the transparent substrate 110. The adhesive layer 161 may, for example, be made of an optical clear adhesive (OCA).

Meanwhile, a case of the resistive touch screen including the transparent substrate 110 on which the transparent electrode 120, the wiring electrode 130, and the conductive paste 140 are formed will be described below.

The first adhesive layer 150 bonding the two sheets of transparent substrates 110 may be formed between the edges of the transparent substrate 110 and a dot spacer insulating between the transparent electrodes 120 when a touch input is not executed may be formed between the inner sides of the transparent substrate 110.

In addition, the transparent electrodes 120 formed on the two sheets of transparent substrates 110 may be formed to face each other and the two transparent electrodes 120 may be in contact with each other when a touch input is executed, to sense a change in resistance or voltage.

Method of Manufacturing Touch Screen

FIGS. 5 to 9 are diagrams for explaining a method of manufacturing the touch screen 100 of FIG. 3. Hereinafter, a method of manufacturing the touch screen 100 according to the present embodiment will be described with reference to these figures.

Figure 5:
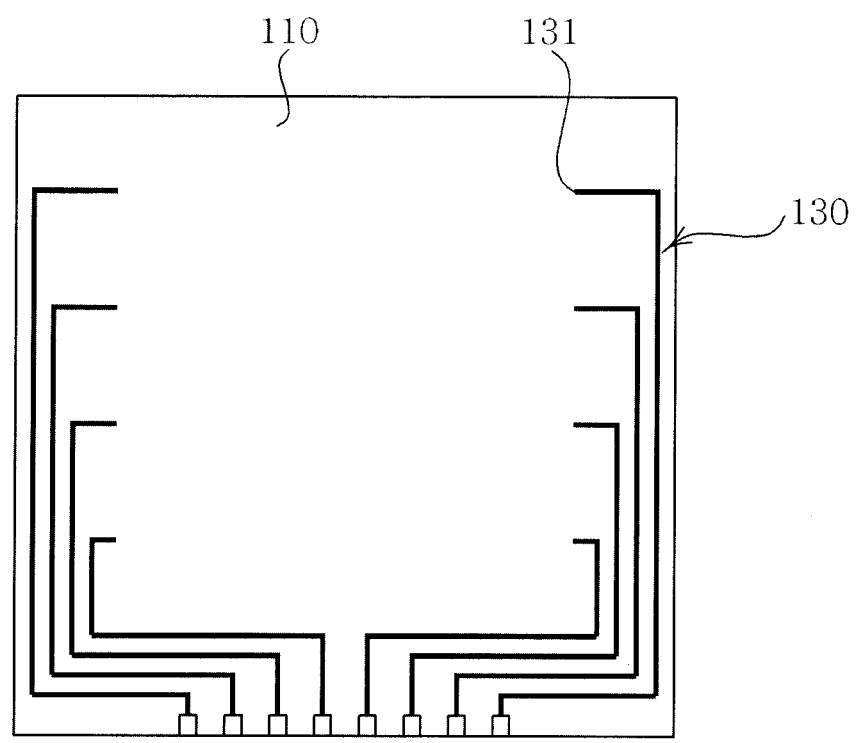
FIGS. 5 to 9 are diagrams for explaining a method of manufacturing the touch screen of FIG. 3.
Figure 6:
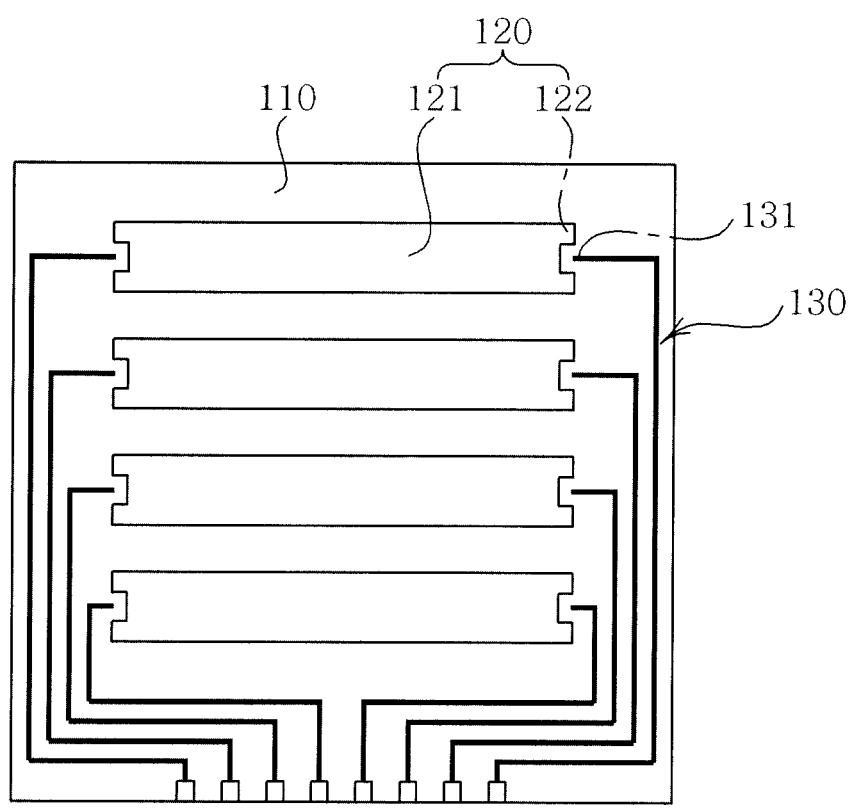
Figure 7:
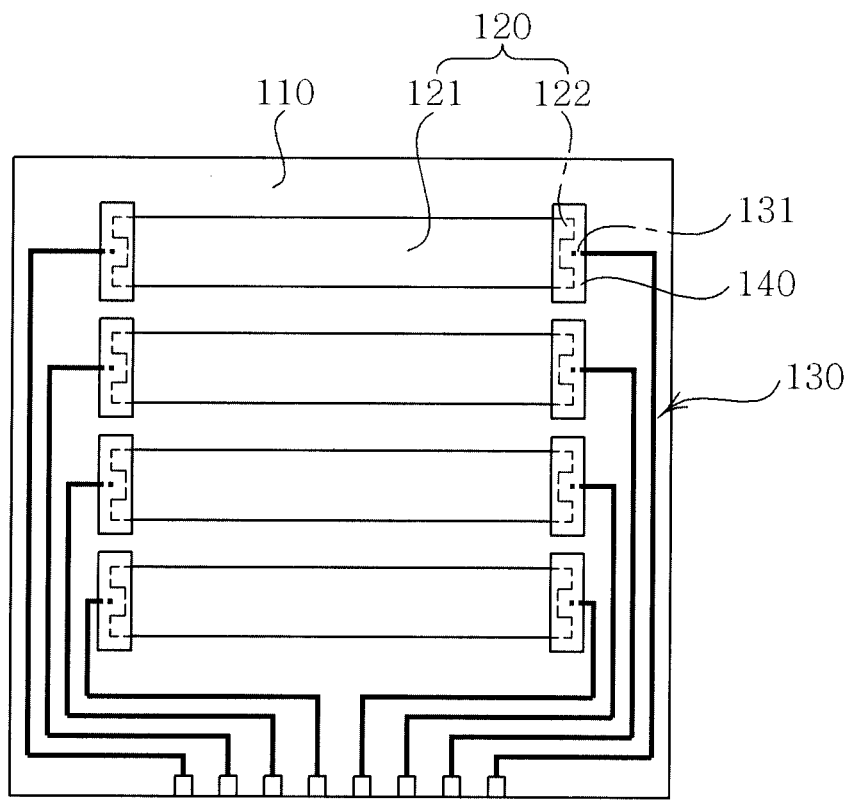
Figure 8:
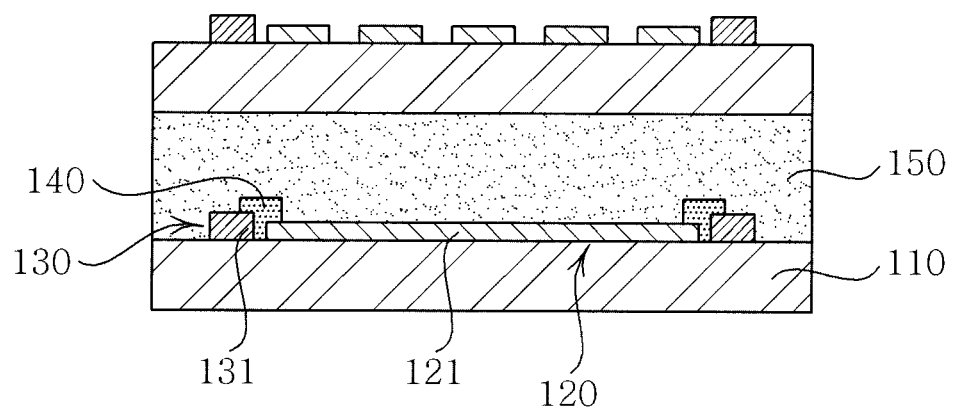
Figure 9:
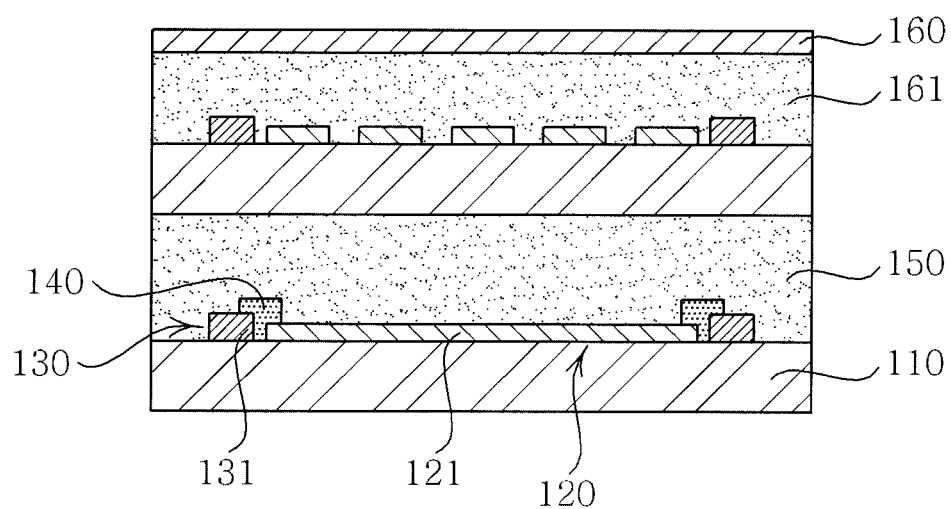

Herein, for convenience of explanation, FIGS. 5 to 7 are shown as process plan views, and FIGS. 8 and 9 are shown as process cross-sectional views.

First, as shown in FIG. 5, the wiring electrodes 130 are formed on the edges of the transparent substrate 110.

At this time, the wiring electrode 130 may be formed by sputtering a metal. More specifically, when the transparent substrate 110 is put in a chamber and ionized atoms (Ar) are accelerated by an electric field to be collided with a metal, the metallic atoms are bounced to be attached to the edges of the transparent substrate 110, such that the wiring electrode 130 may be formed. As the metal, copper, aluminum, gold, silver, or the like, having excellent electrical conductivity may be used.

Meanwhile, the connection part 131 may be formed at a portion to be connected to the transparent electrode 120 of the wiring electrode 130. When the extension part 122 of the transparent electrode 120 is formed in plural, the connection part 131 may also be formed in plural.

Next, as shown in FIG. 6, the transparent electrode 120 is formed on the transparent substrate 110.

At this time, when the transparent electrode 120 is made of a metal oxide, it may be coated on the transparent substrate 110 by deposition, development, etching and the like, and when the transparent electrode 120 is made of a conductive polymer, it may be formed on the transparent substrate 110 by silk screen printing, inkjet printing, gravure printing, offset printing, or the like.

In addition, the transparent electrode 120 may be formed to include the sensing part 121 sensing a touch input and the extension part 122 extending from the sensing part 121 to the edge of the transparent substrate 110 to be spaced apart from the wiring electrode 130. In addition, the extension part 122 may be formed in plural. At this time, the extension part 122 may be formed such that the connection parts 131 are spaced apart between the extension parts 122.

Herein, the transparent electrode 120 is formed after the wiring electrode 130 is formed, thereby making it possible to prevent the transparent electrode 120 from being damaged. More specifically, in the method of manufacturing the touch screen 100 according to the present embodiment, the transparent electrode 120 is formed after the wiring electrode 130 is formed, thereby making it possible to prevent the transparent electrode 120 from being damaged by heat generated at the time of forming the wiring electrode 130. In particular, when the transparent electrode 120 includes a conductive polymer, the transparent electrode 120 is more sensitive to heat, such that the effects may further be remarkable.

Next, as shown in FIG. 7, the conductive paste 140 is applied to cover the extension part 122 of the transparent electrode 120 and the connection part 131 of the wiring electrode 130.

At this time, the conductive paste 140 may be formed to cover the extension part 122 and the connection part 131, thereby making it possible to electrically connect the transparent electrode 120 to the wiring electrode 130. In addition, the conductive paste 140 may be applied by, for example, a screen printing method. For example, the conductive paste 140 may be put on a screen in a state in which the screen is tightly pulled by strong tension and then the conductive paste 140 may be pushed out to the edge of the transparent substrate 110 through a mesh of the screen by moving a squeegee while pushing down the squeegee to thereby be transferred. At this time, the applied conductive paste 140 may cover both the extension part 122 and the connection part 131. In this case, the conductive paste may, for example, be a silver paste.

Next, as shown in FIG. 8, steps of forming the wiring electrode 130, the transparent electrode 120, and the conductive paste 140 on the transparent substrate 110 are repetitively performed and the first adhesive layer 150 is interposed between the two sheets of transparent substrates 110 to bond the two sheets of the transparent substrates 110.

At this time, the transparent electrodes 120 formed on the two sheets of transparent substrates 110 may be formed to have, for example, a bar-type pattern in which the transparent electrodes 120 are perpendicular to each other, thereby making it possible to sense an X-axis coordinate and a Y-axis coordinate, respectively.

Next, as shown in FIG. 9, the second adhesive layer 161 is interposed between the transparent substrate 110 on which the wiring electrode 130, the transparent electrode 120, and the conductive paste 140 are formed and the window plate 160, thereby bonding the transparent substrate 110 to the window plate 160.

By the manufacturing method as described above, the touch screen 100 according to the preferred embodiment of the present invention as shown in FIG. 9 may be manufactured.

In the touch screen and the method of manufacturing the same according to the present invention, the transparent electrode is formed after the wiring electrode is formed, thereby making it possible to prevent the transparent electrode from being damaged by heat generated at the time of forming the wiring electrode.

In addition, according to the present invention, the wiring electrode is not directly connected to the transparent electrode but is electrically connected thereto through the conductive paste, thereby making it possible to minimize effects of the wiring electrode applied to the transparent electrode.

Although the preferred embodiments of the present invention have been disclosed for illustrative purposes, they are for specifically explaining the present invention and thus a touch screen and a method of manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A touch screen, comprising:
   a transparent substrate;
   a transparent electrode formed on the transparent substrate and including a sensing part sensing a touch input and an extension part extending from the sensing part to an edge of the transparent substrate;
   a wiring electrode formed at the edge of the transparent substrate and spaced apart from the extension part of the transparent electrode; and
   a conductive paste formed at the edge of the transparent substrate and covering both the extension part and the wiring electrode so as to electrically connect the transparent electrode to the wiring electrode.

2. The touch screen as set forth in claim 1, wherein the sensing part senses a change in capacitance when a touch input is executed.

3. The touch screen as set forth in claim 1, wherein the extension part is formed in plural, and the wiring electrode includes a plurality of connection parts spaced apart between the extension parts.

4. The touch screen as set forth in claim 1, wherein the transparent substrate on which the transparent electrode, the wiring electrode, and the conductive paste are formed is formed in two sheets and a first adhesive layer is further formed between the two sheets of transparent substrates.

5. The touch screen as set forth in claim 1, further comprising:
   a second adhesive layer formed on the transparent substrate on which the transparent electrode, the wiring electrode, and the conductive paste are formed; and
   a window plate bonded to the transparent substrate by the second adhesive layer.

6. The touch screen as set forth in claim 1, wherein the transparent electrode includes a conductive polymer.

7. The touch screen as set forth in claim 1, wherein the wiring electrode includes copper, aluminum, gold, or silver.

8. The touch screen as set forth in claim 1, wherein the conductive paste is a silver paste.

9. A method of manufacturing a touch screen, comprising:
forming a wiring electrode at an edge of a transparent substrate;
forming a transparent electrode on the transparent substrate, the transparent electrode including a sensing part sensing a touch input and an extension part extending from the sensing part to the edge of the transparent substrate and be spaced apart from the wiring electrode; and
electrically connecting the transparent electrode to the wiring electrode by applying a conductive paste so as to cover the extension part of the transparent electrode and the wiring electrode.

10. The method of manufacturing a touch screen as set forth in claim 9, wherein at the forming the wiring electrode, the wiring electrode is formed by sputtering a metal.

11. The method of manufacturing a touch screen as set forth in claim 10, wherein the metal includes copper, aluminum, gold or silver.

12. The method of manufacturing a touch screen as set forth in claim 9, wherein at the forming the transparent electrode, the extension part is formed in plural and a plurality of connection parts of the wiring electrode are positioned between the extension parts.

13. The method of manufacturing a touch screen as set forth in claim 9, further comprising: after the electrically connecting,
repeating the forming the wiring electrode, the transparent electrode, and the conductive paste on the transparent substrate; and
bonding the two sheets of transparent substrates by interposing a first adhesive layer between the two sheets of transparent substrates.

14. The method of manufacturing a touch screen as set forth in claim 9, further comprising, after the electrically connecting, bonding the transparent substrate to a window plate by interposing a second adhesive layer between the transparent substrate on which the wiring electrode, the transparent electrode, and the conductive paste are formed and the window plate.

15. The method of manufacturing a touch screen as set forth in claim 9, wherein the transparent electrode includes a conductive polymer.

16. The method of manufacturing a touch screen as set forth in claim 9, wherein at the electrically connecting, the conductive paste is a silver paste.

* * * * *